(12) United States Patent
Lu et al.

(10) Patent No.: US 8,951,856 B1
(45) Date of Patent: Feb. 10, 2015

(54) LOW-NOISE, HIGH-GAIN SEMICONDUCTOR DEVICE INCORPORATING BCD (BIPOLAR-CMOS-DMOS) TECHNOLOGY AND PROCESS OF MAKING THE SAME

(71) Applicant: Maxim Integrated Products, Inc., San Jose, CA (US)

(72) Inventors: Xiang Lu, Palo Alto, CA (US); Albert Bergemont, Palo Alto, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/190,164

(22) Filed: Feb. 26, 2014

Related U.S. Application Data

(62) Division of application No. 13/153,932, filed on Jun. 6, 2011, now Pat. No. 8,796,767.

(51) Int. Cl.
*H01L 21/8238* (2006.01)
*H01L 21/28* (2006.01)

(52) U.S. Cl.
CPC .............................. *H01L 21/28035* (2013.01)
USPC ........... 438/203; 438/154; 257/336; 257/412; 257/E21.632

(58) Field of Classification Search
CPC ............ H01L 21/8249; H01L 27/0623; H01L 27/0635; H01L 27/1203; H01L 27/148; H01L 29/1004; H01L 29/66272; H01L 29/7322; H01L 29/765; H01L 29/7801; H01L 29/7809; H01L 29/7816; H01L 29/7835; H01L 21/28035

USPC ........... 438/203, 154; 257/338, 412, E21.632
See application file for complete search history.

(56) References Cited

U.S. PATENT DOCUMENTS

| 4,786,611 | A | 11/1988 | Pfiester |
| 4,887,142 | A | 12/1989 | Bertotti et al. |
| 5,726,488 | A | 3/1998 | Watanabe et al. |
| 5,804,496 | A | 9/1998 | Duane |

OTHER PUBLICATIONS

Dao-Ming Ke, Qi Liu, Jun-Ning Chen, Shan Gao, and Lei Liu; A New Dual-Material Gate LDMOS for RF Power Amplifiers; Anhui University, Department of Microelectronics; 2006; pp. 1-3.

(Continued)

*Primary Examiner* — Stephen W Smoot
*Assistant Examiner* — Vicki B Booker
(74) *Attorney, Agent, or Firm* — Advent, LLP (57) ABSTRACT

Techniques are described to form a low-noise, high-gain semiconductor device. In one or more implementations, the device includes a substrate including a first dopant material having a concentration ranging from about $1 \times 10^{10}/cm^3$ to about $1 \times 10^{19}/cm^3$. The substrate also includes at least two active regions formed proximate to a surface of the substrate. The at least two active regions include a second dopant material, which is different than the first dopant material. The device further includes a gate structure formed over the surface of the substrate between the active regions. The gate structure includes a doped polycrystalline layer and an oxide layer formed over the surface between the surface and the doped polycrystalline layer. The doped polycrystalline layer includes the first dopant material having a concentration ranging from about $1 \times 10^{19}/cm^3$ to about $1 \times 10^{21}/cm^3$.

5 Claims, 7 Drawing Sheets

(56) References Cited

OTHER PUBLICATIONS

Antonio Andreini, Claudio Contiero, and Paola Galbiati; A New Integrated Silicon Gate Technology Combining Bipolar Linear, CMOS Logic, and DMOS Power Parts; Dec. 1996; IEEE Transactions on Electron Devices; vol. ED-33, No. 12; pp. 2025-2030.

Il-Yong Park, Yong-Keon Choi, Kwang-Young Ko, Chul-Jin Yoon, Bon-Keun Jun, Mi-Young Kim, Yon-Chol Lim, Nam-Joo Kim and Kwang-Dong Yoo; BD180—A New 0.18 um BCD (Bipolar-CMOS-DMOS) Technology from 7V to 60V; May 18-22, 2008; Orlando, FL; Proceedings on the 20th International Symposium on Power Semiconductor Devices & IC's; pp. 64-67.

Il-Yong Park, Yong-Keon Choi, Kwang-Young Ko, Sang-Chul Shim, Bon-Keun Jun, Nam-Chil Moon, Nam-Joo Kim and Kwang-Dong Yoo; BCD (Bipolar-CMOS-DMOS) Technology Trends for Power Management IC; May 30-Jun. 3, 2011; The Shilia Jeju, Korea; 8th International Conference on Power Electronics—ECCE Asia; pp. 318-325.

LOW-NOISE, HIGH-GAIN SEMICONDUCTOR DEVICE INCORPORATING BCD (BIPOLAR-CMOS-DMOS) TECHNOLOGY AND PROCESS OF MAKING THE SAME

BACKGROUND

Bipolar CMOS DMOS (BCD) processes are utilized to integrate bipolar junction transistors and complementary metal-oxide-semiconductor (CMOS) technology into a single integrated circuit device. Devices fabricated from the BCD process may be utilized in mix-signal and analog devices. For example, the bipolar devices offer high speed, high gain for such devices as high-frequency analog amplifiers, whereas CMOS technology offers high input resistance and allows for the construction of simple, low-power logic gates. However, noise is a major performance limiting factor in these types of devices. Noise may change the value of the signal, cause a loss of information, and/or reduce the resolution of the circuit.

SUMMARY

Techniques are described to form a low-noise, high-gain semiconductor device. In one or more implementations, the device includes a substrate including a first dopant material having a concentration ranging from about $1\times10^{10}/cm^3$ to about $1\times10^{19}/cm^3$. The substrate also includes at least two active regions formed proximate to a surface of the substrate. In one or more examples, the substrate may be comprised of a well (e.g., n-well), or the like. The active regions include a second dopant material, which is different than the first dopant material. The device further includes a gate structure formed over the surface of the substrate between the active regions. The gate structure is comprised of a doped silicon polycrystalline layer and an oxide layer formed over the surface between the surface and the doped polycrystalline layer. The doped polycrystalline layer is comprised of the first dopant material having a concentration ranging from about $1\times10^{19}/cm^3$ to about $1\times10^{21}/cm^3$.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

BCD process devices are utilized to construct analog devices (e.g., continuously variable signal), mixed signal devices (e.g., analog and digital circuits), or the like. For instance, the device may be utilized in amplifiers, such as audio amplifiers, or the like. However, noise, such as intrinsic noise (e.g., thermal noise), typically limits the performance (e.g., range, resolution, signal value, etc.) of these devices.

Therefore, techniques are described to form a low-noise, high-gain semiconductor device. In one or more implementations, the device includes a substrate including a first dopant material having a concentration from about $1\times10^{10}/cm^3$ to about $1\times10^{19}/cm^3$. In another implementation, the concentration may be about $1\times10^{12}\ cm^3$ to about $1\times10^{18}/cm^3$. In yet another implementation, the concentration may be about $1\times10^{13}/cm^3$ to about $1\times10^{17}/cm^3$. The substrate also includes at least two active regions formed proximate to a surface of the substrate. In one or more examples, the substrate may be comprised of a well (e.g., n-well), or the like. The at least two active regions are comprised of a second dopant material, which is different than the first dopant material. The device further includes a gate structure formed over the surface of the substrate between the active regions. The gate structure is comprised of a doped polycrystalline layer and an oxide layer formed over the surface between the surface and the doped polycrystalline layer. The doped substrate is comprised of the first dopant material having a concentration ranging from about $1\times10^{10}/cm^3$ to about $1\times10^{19}/cm^3$. In another implementation, the concentration may be about $1\times10^{12}\ cm^3$ to about $1\times10^{18}/cm^3$. In yet another implementation, the concentration may be about $1\times10^{13}/cm^3$ to about $1\times10^{17}/cm^3$. Moreover, in one or more implementations, the doped polycrystalline layer may be comprised of a first doped polycrystalline region, a second doped polycrystalline region, and a third doped polycrystalline region.

As discussed herein, the semiconductor device includes a doped substrate that provides increased mobility of majority carriers in the device. The increased mobility allows for an increased transconductance factor, which reduces intrinsic noise in the device. For instance, the device may have a voltage noise reduction and a current noise reduction versus similarly constructed devices (e.g., similar gate lengths, etc.). Moreover, the device may have improved device matching.

In the following discussion, an example semiconductor device is first described. Exemplary procedures are then described that may be employed to fabricate the example semiconductor device.

Example Implementations

FIGS. 1A through 2D illustrate a semiconductor device 100 in accordance with an example implementation of the present disclosure. As shown, the semiconductor device 100 includes one or more active regions 102 formed in a substrate 104. The active regions 102 are utilized to create integrated circuit device technology (e.g., complimentary metal-oxide-semiconductor (CMOS) technology, microelectromechanical systems (MEMS) technology, etc.). The active regions 102 may be comprised of acceptor elements (e.g., acceptor atoms, acceptor dopants) or donor elements (e.g., donor atoms, donor dopants), depending on the type of the device 100 (e.g., n-type device, p-type device). The active regions 102 may be configured in a variety of ways. The active regions 102 are capable of providing charge carriers to the device 100. For example, an active silicon region 102 may be comprised of an n-type diffusion region that is capable of providing extra conduction electrons as charge carriers. In another example, an active silicon region 102 may be comprised of a p-type diffusion region that is capable of providing extra holes as charge carriers. The one or more active regions 102 are formed proximate to a surface 106 of the substrate 104.

The substrate 104 comprises a base material utilized to form one or more electronic devices through various fabrication techniques such as photolithography, ion implantation, deposition, etching, and so forth. The substrate 104 may be configured in a variety of ways. In an implementation, the substrate 104 may be at least partially comprised of a silicon wafer. The substrate 104 may comprise an n-type silicon wafer or a p-type silicon wafer. For example, the substrate 104 may comprise a group V element (e.g., phosphorus, arsenic, antimony, etc.) to furnish n-type charge carrier elements to the silicon wafer. In another example, the substrate 104 may comprise a group IIIA element (e.g., boron, etc.) to furnish p-type charge carrier elements to the silicon wafer.

Figure 1A:
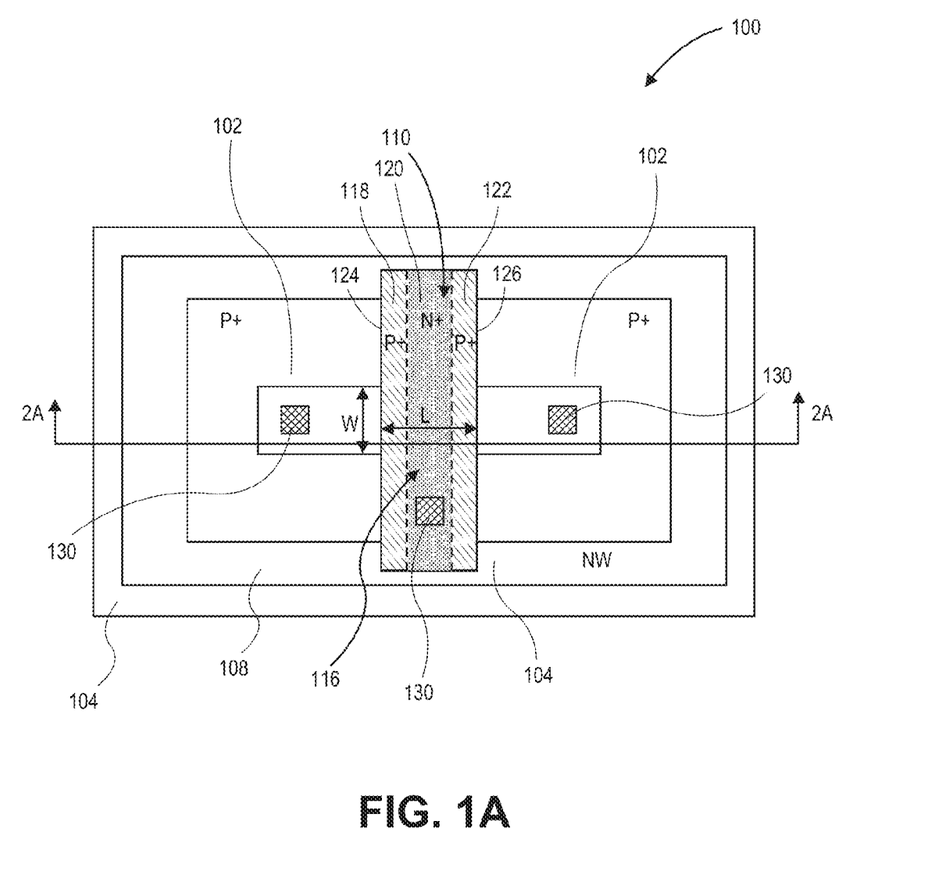
FIG. 1A is a diagrammatic partial plan view illustrating a p-type semiconductor device in accordance with an example implementation of the present disclosure.
Figure 1B:
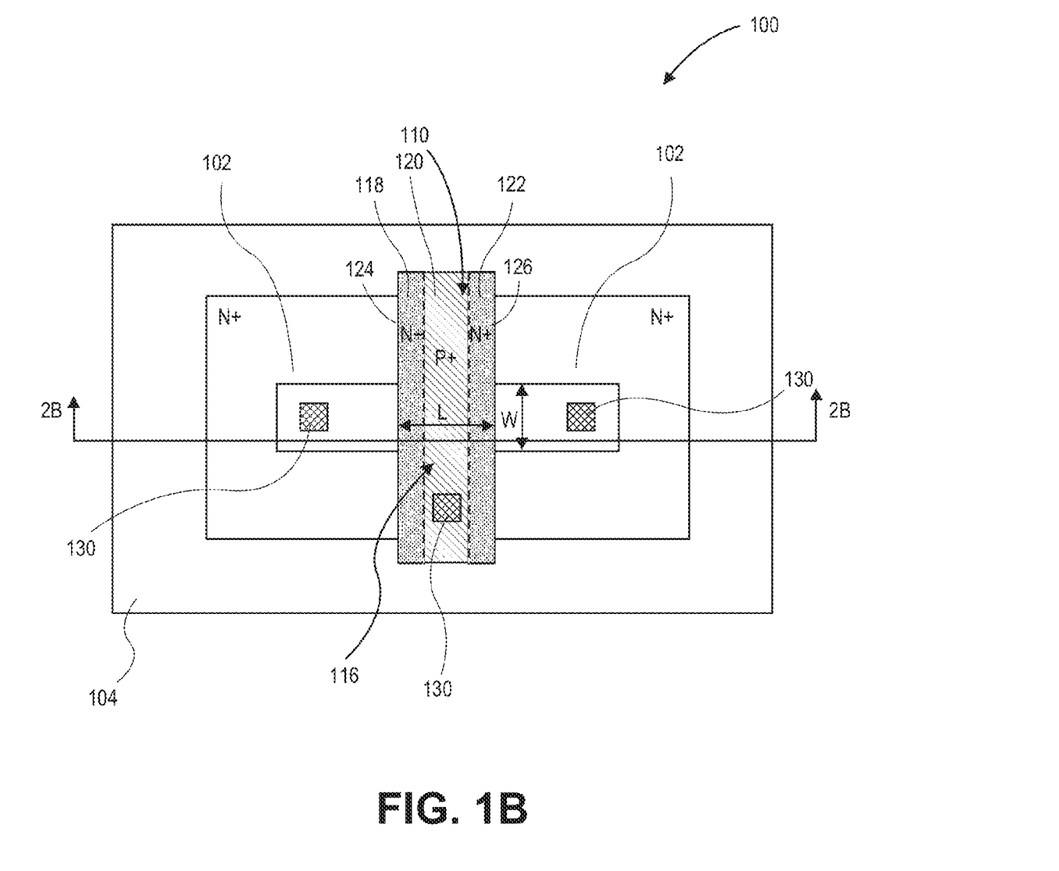
FIG. 1B is a diagrammatic partial plan view illustrating an n-type semiconductor device in accordance with an example implementation of the present disclosure.
Figure 1C:
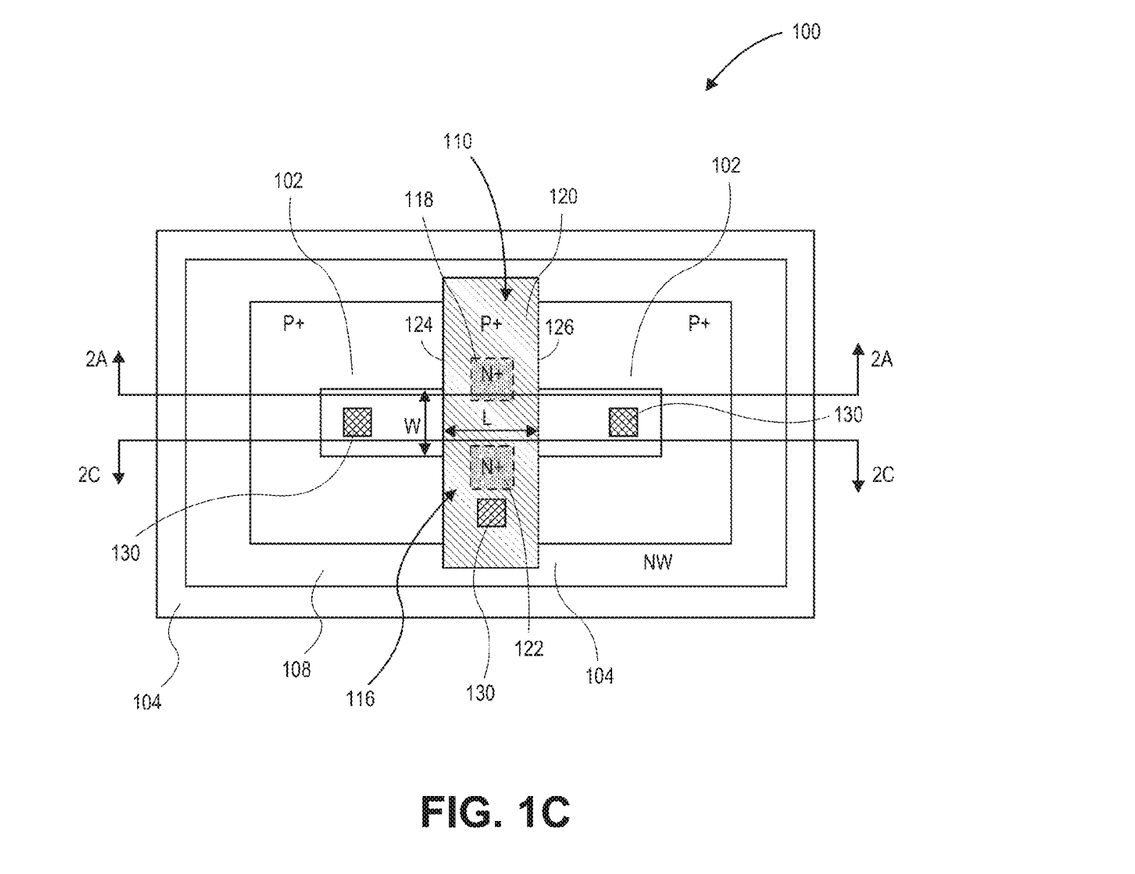
FIG. 1C is a diagrammatic partial plan view illustrating a p-type semiconductor device in accordance with another example implementation of the present disclosure.

In one or more implementations, the substrate 104 may include a well 108 (see FIGS. 1A and 1C). For example, the well 108 comprises an n-well when the substrate 104 comprises a p-type substrate. In another example, the well 108 comprises a p-well when the substrate 104 comprises an n-type substrate. As illustrated in the implementation shown in FIGS. 1A and 1C, the substrate 104 includes an n-well 108 and two p-type active regions 102 to form a PMOS transistor. In this implementation, the n-well 108 is a lightly doped n-well having a dopant concentration ranging from about $1 \times 10^{10}/cm^3$ to about $1 \times 10^{19}/cm^3$. In another implementation, the concentration may range from about $1 \times 10^{12}/cm^3$ to about $1 \times 10^{18}/cm^3$. In yet another implementation, the concentration may range from about $1 \times 10^{13}/cm^3$ to about $1 \times 10^{17}/cm^3$. The lightly doped n-well 108 lowers the intrinsic threshold voltage. For example, in this implementation, the threshold voltage may be lowered by about point three (0.3) volts to about point eight (0.8) volts. Moreover, the lightly doped n-well 104 increases the mobility of the majority carriers, which increases the transconductance factor (e.g., the $g_m$ factor) of the device 100. In one example, the transconductance factor of the device 100 was increased by up to about eighty (80) percent compared with similarly fabricated transistor devices (e.g., differing doping level, etc.). Moreover, the improved transconductance factor also decreases the intrinsic noise (e.g., 1/f noise) of the device 100. In one example, the noise factor was reduced by up to about fifty (50) percent compared with the similarly fabricated transistor devices. In one or more implementations, the well 108 may comprise the substrate 104 for the semiconductor device 100. The well 108 may be fabricated through suitable semiconductor fabrication techniques (e.g., diffusion, implantation, annealing, etc.).

As shown in FIGS. 1A through 2D, the semiconductor device 100 includes a gate structure 110 that is positioned over the surface 106 and between the active regions 102. The gate width (W) of structure 110 may range from about one (1) micron to thousands of microns. In an implementation, the gate structure 110 may have a gate width of approximately ten (10) microns. The gate length (L) of structure 110 may range from about point two (0.2) microns to hundreds of microns. In an implementation, the gate length may be about one (1) micron. An inversion layer 112 is formed below the gate structure 110 when a voltage of the correct polarity and a value greater than a threshold voltage ($V_t$) of the device 100 is applied to the gate structure 110. The inversion layer 112 establishes a conducting channel (see arrow illustrating a conducting channel in FIGS. 2A through 2D) through which majority carriers (holes in a PMOS transistor, electrons in a NMOS transistor) can travel from a first active region 102 (e.g., source) to a second active region 102 (e.g., drain). The gate structure 110 is configured in a variety of ways. The gate structure 110 includes a dielectric layer 114 disposed between the surface 106 and a polycrystalline silicon (polysilicon) layer 116. In an implementation, the dielectric layer 114 may comprise an oxide material, such as silicon dioxide ($SiO_2$), a nitride material, or the like.

Figure 1D:
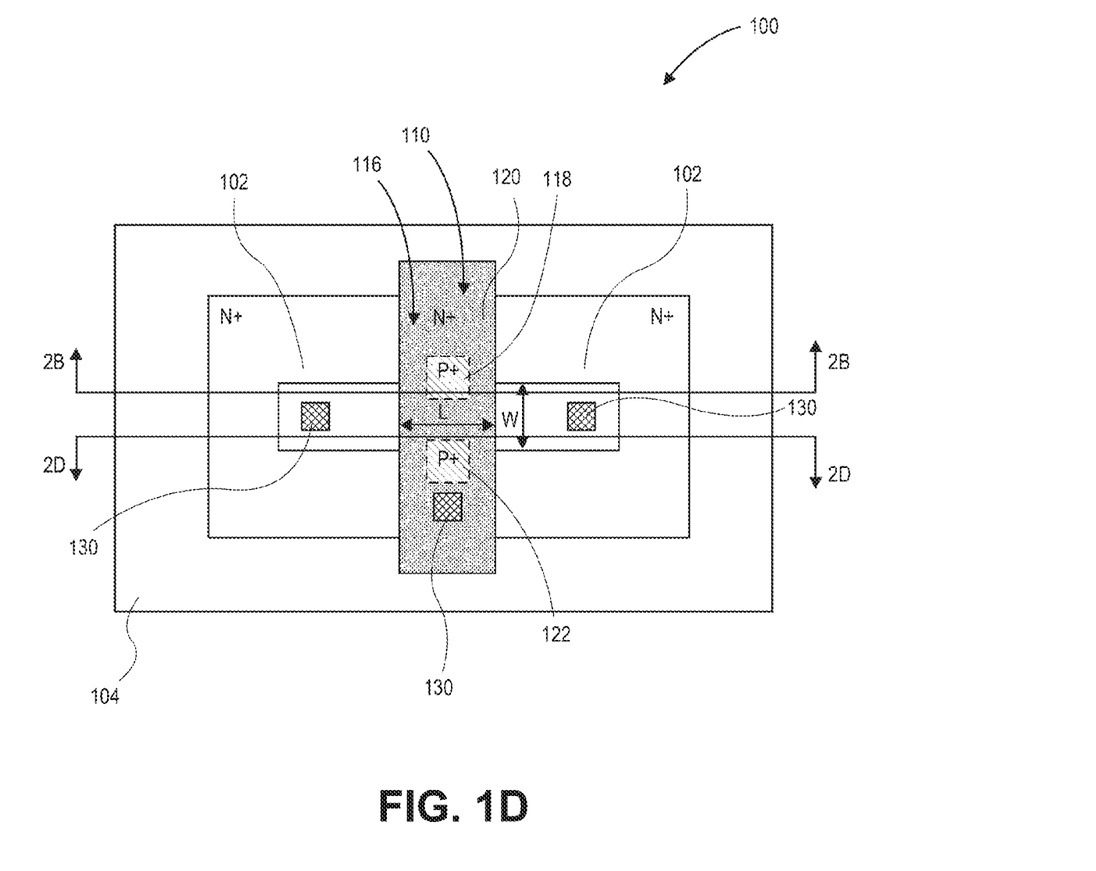
FIG. 1D is a diagrammatic partial plan view illustrating an n-type semiconductor device in accordance with another example implementation of the present disclosure.
Figure 2A:
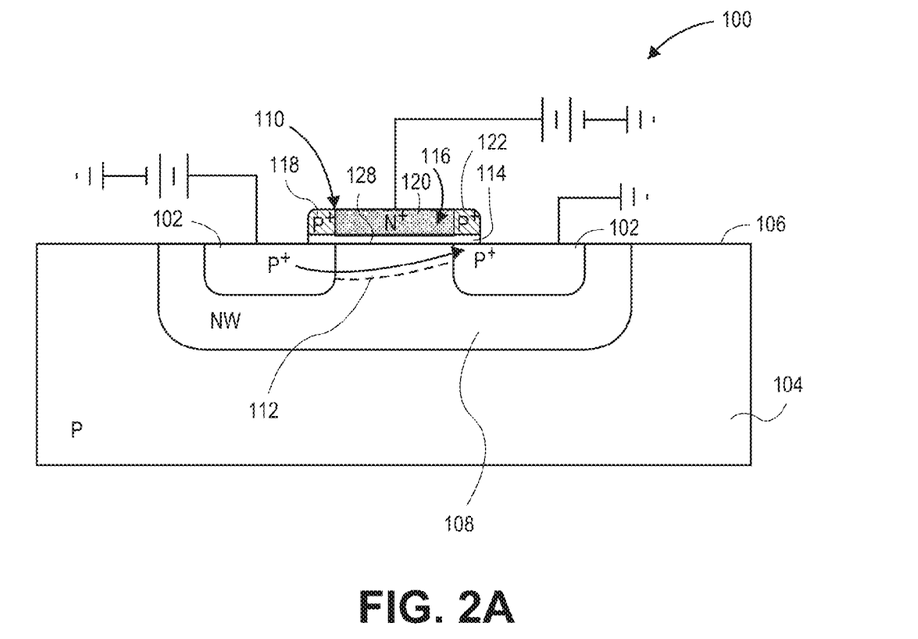
FIG. 2A is a diagrammatic partial cross-sectional side view illustrating the semiconductor device shown in FIGS. 1A and 1C, where an inversion layer is formed due to the voltage provided at a gate structure of the device and the arrow illustrates a buried conduction channel due to the work function of the gate structure.
Figure 2B:
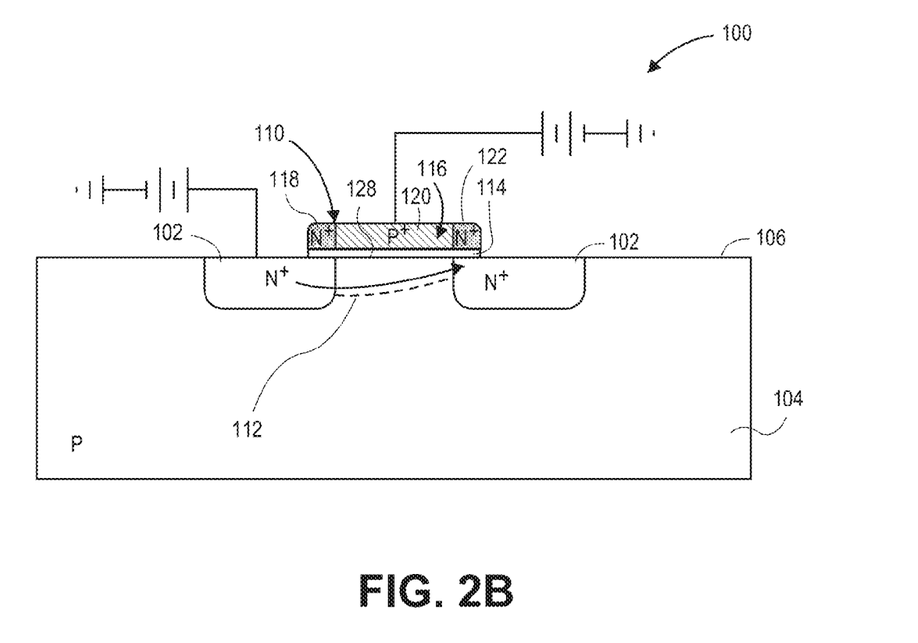
FIG. 2B is a diagrammatic partial cross-sectional side view illustrating the semiconductor device shown in FIGS. 1B and 1D, where an inversion layer is formed due to the voltage provided at a gate structure of the device and the arrow illustrates a buried conduction channel due to the work function of the gate structure.
Figure 2C:
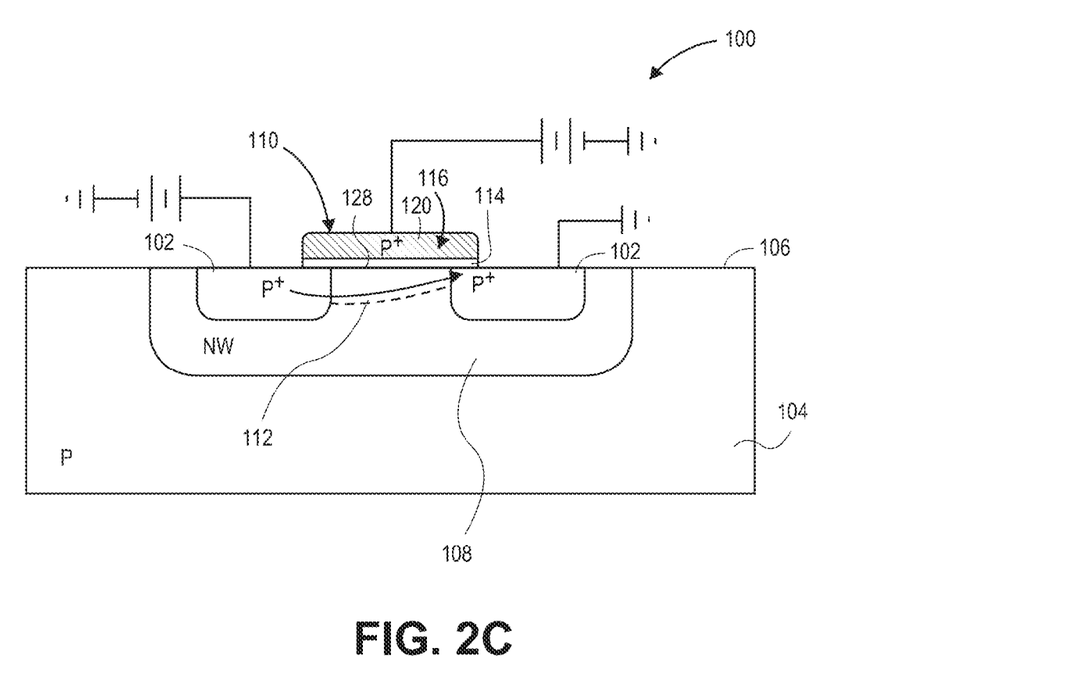
FIG. 2C is a diagrammatic partial cross-sectional side view illustrating the semiconductor device shown in FIG. 1C, where an inversion layer is formed due to the voltage provided at a gate structure of the device and the arrow illustrates a buried conduction channel due to the work function of the gate structure.
Figure 2D:
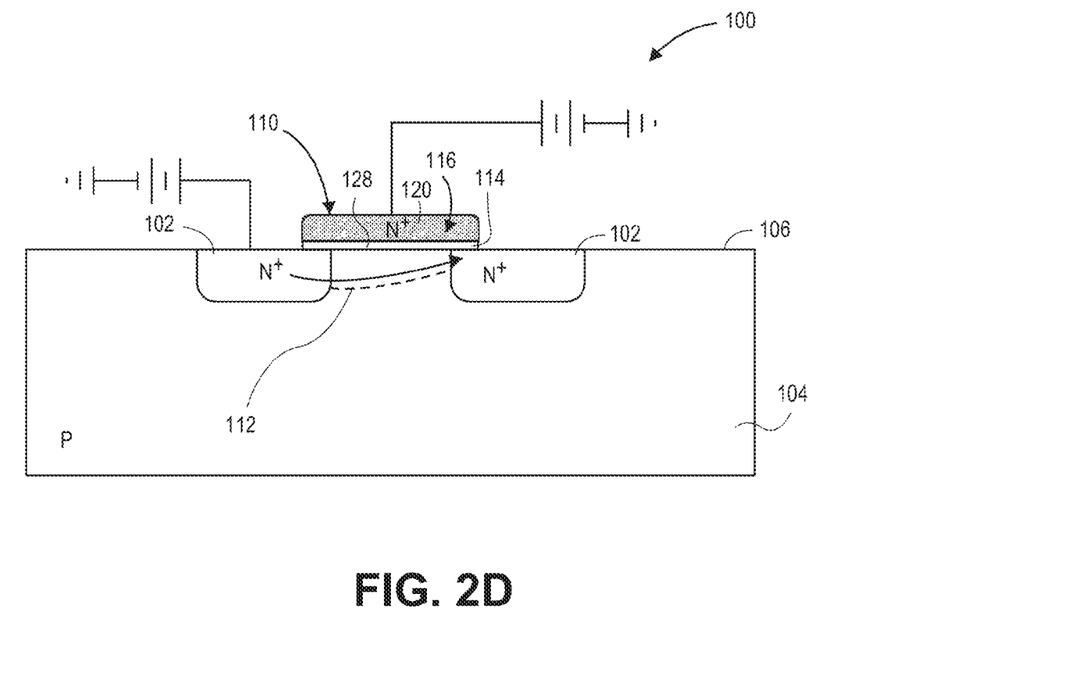
FIG. 2D is a diagrammatic partial cross-sectional side view illustrating the semiconductor device shown in FIG. 1D, where an inversion layer is formed due to the voltage provided at a gate structure of the device and the arrow illustrates a buried conduction channel due to the work function of the gate structure.

The doped polysilicon layer 116 may be configured in variety of ways. For example, as illustrated in FIGS. 1A through 1D, the doped polysilicon layer 116 may be comprised of a first doped polysilicon region 118, a second doped polysilicon region 120, and a third doped polysilicon region 122. In an implementation, as shown in FIGS. 1A and 1B, the second doped polysilicon region 120 may be disposed between the first doped polysilicon region 118 and the third polysilicon region 122 along a first (e.g., vertical) axis. Moreover, the first and third regions 118, 122 are formed proximate to the outside edges 124, 126 of the gate structure 110 along a second and a third (e.g., vertical) axes. It is contemplated that the first doped polysilicon region 118 and the third polysilicon region 122 may be comprised of a first dopant material (e.g., p+ dopant material in FIG. 1A, n+ dopant material in FIG. 1B) while the second doped polysilicon region 120 may be comprised of a second dopant material (e.g., n+ dopant material in FIG. 1A, p+ dopant material in FIG. 1B). In another example, as shown in FIGS. 1C and 1D, the first region 118 and the third region 122 may be formed such that the regions 118, 122 at least partially overlap the active region 102 covered by the gate structure 110 (as shown in FIGS. 1C, 1D, 2A, and 2B). However, in this implementation, the second polysilicon region 120 at least substantially overlaps the inversion layer 112 region (e.g., region where the inversion layer 112 forms when device 100 is activated) and does not at least substantially overlap the active regions 102 (see FIGS. 1A and 2B). Moreover, the first region 118 and the third region 122 are at least substantially surrounded by the second region 120 and comprised of at least two separate and distinct regions in this implementation. It is contemplated that other doping configurations are possible depending the desired characteristics of device 100.

In an implementation, the concentration of p+ dopant material and/or n+ dopant material comprising the first and third regions 118, 122 may range from about $1\times10^{19}/cm^3$ to about $1\times10^{21}/cm^3$. In another implementation, the concentration may range from about $5\times10^{19}/cm^3$ to about $9\times10^{20}/cm^3$. In yet another implementation, the concentration may range from about $9\times10^{19}/cm^3$ to about $1\times10^{20}/cm^3$. However, it will be appreciated that the doping level of the polysilicon layer 116 (e.g., the first, second, and third regions 118, 120, 122) may be varied depending on the particular design/performance requirements of the semiconductor device 100 (e.g., the size of the device 100, the width (W) and the length (L) of the gate structure 110, etc.). It is contemplated that the regions 118, 122 may have the same doping concentration profile. For example, regions 118, 122 may both have a doping concentration of $1\times10^{21}/cm^3$. It is also contemplated that the regions 118, 122 may also have a different doping profile. For example, the first region 118 may have a doping concentration of $1\times10^{19}/cm^3$, and the third region 122 may have a doping concentration of $1\times10^{21}/cm^3$.

In an implementation, as illustrated in FIGS. 1A, 1C, 2A, and 2C, the semiconductor device 100 is a PMOS transistor. For example, the active regions 102 are comprised of a p-type active region, the first and third regions 118, 122 are formed of a p+ type dopant material, and the second region 120 is formed of an n+ type dopant material. As described above, an inversion layer 112 is formed below the gate structure 110 when a sufficient voltage value is applied to the gate structure 110. However, the work function of the gate structure 110 causes the conducting channel to shift lower (e.g., shift away from the interface 128 of the oxide layer 114 and the surface 106), which causes the semiconductor device 100 to function as a buried channel semiconductor device. Moreover, the dopants of the polysilicon layer 116 causes the threshold voltage of the device 100 to increase. For example, the threshold voltage may increase by about one (1) volt. However, it is contemplated that the threshold voltage value may vary due to different doping levels.

In another implementation illustrated in FIGS. 1B, 1D, 2B, and 2D, the semiconductor 100 comprises an NMOS transistor. For example, the active regions 102 are comprised of an n-type active region, the first and third regions 118, 122 are formed of an n+ type dopant material, and the second region 120 is formed of a p+ type dopant material. Moreover, the substrate 104 may be comprised of a lightly doped p-type material, akin to the n-well shown in FIGS. 1A, 1C, 2A, and 2D. For example, the p-type dopant material concentration of the substrate 104 may range from about $1\times10^{10}/cm^3$ to about $1\times10^{19}/cm^3$. In another example, the p-type dopant material concentration may range from about $1\times10^{13}/cm^3$ to about $1\times10^{17}/cm^3$. The higher mobility of the majority carriers (e.g., electrons), due to the doping level of semiconductor device 100, allows for an increased transconductance factor. However, this doping level also increases the threshold voltage of the device 100. Moreover, as with the PMOS implementation described above, the doping levels of the polysilicon layer 116 causes the device 100 to function as a buried channel device, which increases the threshold voltage of the device 100. In an implementation, the threshold voltage may increase by about one (1) volt.

As illustrated in FIGS. 1A through 1D, the semiconductor device 100 includes one or more contacts 130. The contacts 130 provide electrical interconnection capabilities between various components of device 100. The contacts may be fabricated via one or more suitable fabrication techniques (e.g., photolithography, etching, etc.).

The semiconductor device 100 may be fabricated utilizing the one hundred and eighty (180) nanometer (nm) process node. For example, the length (L) of the gate structure 110 may be about one hundred and eighty (180) nanometers. However, it is understood that the present disclosure may be utilized in other process nodes such that the gate length may be more than one hundred and eighty (180) nanometers or less than one hundred and eighty (180) nanometers. Therefore, the doping levels may be chosen to appropriately accommodate the various characteristics described above and herein. For example, the doping levels of the substrate 104 (well 108) and the polysilicon layer 116 may be changed as future process nodes (e.g., smaller process nodes) are utilized to keep in line with the characteristics (e.g., mobility, threshold voltage, etc.) described above.

Example Fabrication Processes

The following discussion describes example techniques for fabricating a low-noise semiconductor device such as the semiconductor device 100 shown in FIGS. 1A through 2D. In the process 300 illustrated, at least two active regions are formed in a substrate (Block 302). As noted, the substrate is comprised of a first dopant material having a concentration ranging from about $1\times10^{10}/cm^3$ to about $1\times10^{19}/cm^3$. The substrate may also be comprised of a first dopant material having a concentration ranging from about $1\times10^{13}/cm^3$ to about $1\times10^{17}/cm^3$. The active regions may be comprised of acceptor elements (e.g., acceptor atoms, acceptor dopants) or donor elements (e.g., donor atoms, donor dopants), depending on the type of semiconductor device (e.g., n-type device, p-type device). The active regions are capable of providing charge carriers to the device. For example, an active silicon region may be comprised of an n-type diffusion region that is capable of providing extra conduction electrons as charge carriers. In another example, an active silicon region may be comprised of a p-type diffusion region that is capable of providing extra holes as charge carriers. The active regions may be formed via suitable deposition techniques. These techniques may include, but are not limited to: chemical vapor deposition, physical vapor deposition, molecular beam epitaxy, and so forth.

As described above, the substrate is a base material utilized to form one or more electronic devices through various fabrication techniques such as photolithography, ion implantation, deposition, etching, and so forth. The substrate may comprise an n-type silicon wafer or a p-type silicon wafer. For example, the substrate may comprise a group V element (e.g., phosphorus, arsenic, antimony, etc.) to furnish n-type charge carrier elements to the silicon wafer. In another example, the substrate may comprise a group IIIA element (e.g., boron, etc.) to furnish p-type charge carrier elements to the silicon wafer.

Figure 3:
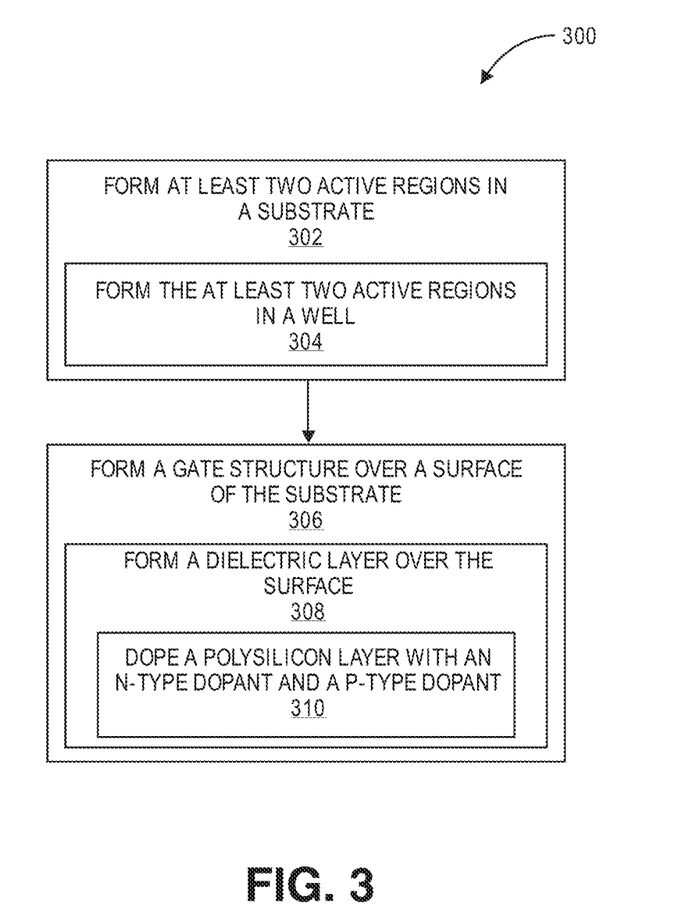
FIG. 3 is a flow diagram illustrating an example process for fabricating the semiconductor devices illustrated in FIGS. 1A through 2D.

In an implementation, as illustrated in FIG. 3, the active regions may be formed in a well (Block 304). For example, as illustrated in FIG. 1A, the well 108 comprises an n-well having an n-type dopant concentration ranging from about $1\times10^{13}/cm^3$ to about $1\times10^{17}/cm^3$.

The lightly doped well increases the mobility of the majority carriers in device 100, which increases the transconductance factor of the device. The increased transconductance factor may also decrease the intrinsic noise factor (e.g., 1/f noise factor). The threshold voltage of device 100 is also decreased due to the lowered dopant concentration of the well.

A gate structure is formed over the surface of the substrate (Block 306) between the active regions. The gate structure may be formed by first forming a dielectric layer over the surface (Block 308). The polysilicon layer formed over the gate oxide is doped with an n-type dopant and a p-type dopant (Block 310). For instance, a second polysilicon region may be deposited over the dielectric layer. Then, a first and a third polysilicon region may be selectively formed (e.g., via selective implantation, or the like) in the second region. As described above, with respect to the first, second, and third regions 118, 120, 122, the second region may be comprised of a first dopant material (e.g., p+) while the first and third regions are comprised of a second dopant material (e.g., n+). The gate structure may be formed via suitable semiconductor fabrication techniques (e.g., etching, deposition, annealing, etc.). In one or more implementations, the dielectric layer may comprise an oxide material (e.g., silicon dioxide), a nitride material, combinations thereof, or the like. When a voltage of a particular polarity and value is applied to the gate structure, an inversion layer is formed under the surface of the substrate (e.g., below the interface of the dielectric layer and the surface). The inversion layer provides a conduction channel between the active regions.

In an implementation, the second polysilion region may be disposed between the first and the third polysilicon regions (see FIGS. 1A and 1B). In this implementation, the regions are formed along multiple (e.g., vertical) axes. In another implementation, the first and the third regions may be formed as distinct and separate regions that are at least substantially surrounded by the second region (see FIGS. 1C and 1D).

In an implementation, the concentration of dopant material in the first and third regions may range from about $1\times10^{19}/cm^3$ to about $1\times10^{21}/cm^3$, and the concentration of dopant material in the second region may range from about $1\times10^{19}/cm^3$ to about $1\times10^{21}/cm^3$. Due to the high concentration of doping, the work function of the gate structure causes the conducting channel to shift lower causing the device to function as a buried channel device. Moreover, the high concentration of doping causes the threshold voltage of the device to increase. For example, in various implementations, the high concentration of dopants may increase the threshold voltage about one (1) volt.

The semiconductor device may be fabricated via various suitable semiconductor fabrication techniques. For instance, the semiconductor device may be fabricated utilizing a biCMOS-DMOS (BCD) process, or the like. The BCD process integrates bipolar junction transistor technology and CMOS transistor technology into a single integrated circuit device. Therefore, the semiconductor device (e.g., semiconductor device 100 illustrated in FIGS. 1A through 2D) may interface and/or communicate with other transistors (e.g., bipolar transistors, CMOS transistors) to perform various functionalities. For example, the semiconductor device may be utilized in analog circuits, such as audio circuits, amplifier circuits, or the like. Moreover, it is contemplated that the doping concentration of the semiconductor device may be varied depending on the requirements (e.g., different process nodes, power requirements, mobility requirements, etc.) of the device.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A process comprising:
    forming at least two active regions proximate to a surface of a substrate, the substrate including a first dopant material having a concentration ranging from about $1\times10^{13}/cm^3$ to about $1\times10^{17}/cm^3$ to increase a transconductance factor, the at least two active regions including a second dopant material; and
    forming a gate structure over the surface of the substrate between the at least two active regions, the gate structure including a doped polycrystalline layer and oxide layer formed between the doped polysilicon layer and the surface, the doped polycrystalline layer including a second dopant material having a concentration ranging from about $1\times10^{19}/cm^3$ to about $1\times10^{21}/cm^3$,
    wherein the doped polycrystalline layer further comprises a first doped polycrystalline region including the second dopant material having a concentration ranging from about $1\times10^{19}/cm^3$ to about $1\times10^{21}/cm^3$, a second doped polycrystalline region including the first dopant material having a concentration ranging from about $1\times10^{19}/cm^3$ to about $1\times10^{21}/cm^3$, and a third doped polycrystalline region including the second dopant material having a concentration ranging from about $1\times10^{19}/cm^3$ to about $1\times10^{21}/cm^3$, the first doped polycrystalline region and the third doped polycrystalline region comprise at least two separate and distinct regions disposed within an interior of the second doped polycrystalline region.

2. The process as recited in claim 1, wherein the second doped polycrystalline region is disposed between the first doped polycrystalline region and the third doped polycrystalline region.

3. The process as recited in claim 1, wherein the substrate comprises a well.

4. The process as recited in claim 3, further comprising:
    forming the at least two active regions in the well.

5. The process as recited in claim 1, wherein the first dopant material comprises a p-type dopant material and the second dopant material comprises an n-type dopant material.

* * * * *